United States Patent [19]

Simms et al.

[11] 4,077,851

[45] Mar. 7, 1978

[54] PATTERNED CHROMATE FILM PROCESS

[75] Inventors: Douglas Leon Simms, East Orange; Peter Kenny Skurkiss, Short Hills, both of N.J.; Clark Woody White, Oak Ridge, Tenn.

[73] Assignee: Bell Telephone Laboratories, Incorporated, Murray Hill, N.J.

[21] Appl. No.: 774,482

[22] Filed: Mar. 4, 1977

[51] Int. Cl.$^2$ .................... C25D 5/02; C23C 15/00
[52] U.S. Cl. .................... 204/15; 204/192 E
[58] Field of Search .................... 204/15, 192 E, 18 R

[56] References Cited

U.S. PATENT DOCUMENTS

| 1,857,929 | 5/1932 | McFarland | 204/18 R |
|---|---|---|---|
| 1,862,231 | 6/1932 | McFarland | 204/18 R |
| 2,028,013 | 1/1936 | Reilly | 204/18 R |
| 3,523,067 | 8/1970 | Baird-Kerr et al. | 204/38 S |
| 3,625,844 | 12/1971 | McKean | 204/140 |
| 3,632,389 | 1/1972 | Vazirani | 204/51 |

OTHER PUBLICATIONS

Metal Finishing, Sept. 1975, pp. 29–35.
Journal of Electrochemical Society, vol. 120, No. 6, June 1973, pp. 735–738.
Characterization of Solid Surfaces, 1974, P. F. Kane, et al., Ed. pp. 641–660.
Protective Coatings of Metals, third Ed. 1967, ACS Monograph Series 163, R. M. Burns, pp. 27–54.
Gold Plating Technology, by F. H. Reid, et al., 1974, pp. 21–52.
Modern Electroplating, second Ed., 1963, F. W. Lowenheim, pp. 224–244.
Journal of Vacuum Science and Technology, vol. 13, No. 5, Sept./Oct. 1976, pp. 1008–1022.

*Primary Examiner*—T. M. Tufariello
*Attorney, Agent, or Firm*—Walter G. Nilsen

[57] ABSTRACT

A process is described for putting down patterned chromate films on metal substrates. The procedure involves first forming a chromate film on the metal surface and then forming the patterned chromate film. The pattern is formed by sputtering the substrate through a suitable shadow mask. This procedure yields patterned chromate films with high dimensional tolerance limits. Such patterns are particularly useful in the fabrication of electronic artifacts, as for example, a mask in gold plating processes.

10 Claims, 4 Drawing Figures

PATTERNED CHROMATE FILM PROCESS

BACKGROUND OF THE INVENTION

1. Field of the Invention

The invention is a process for producing patterned chromate film on metal substrates.

2. Description of the Prior Art

Chromate films are extensively used in commerce as protection against corrosion and as an antistaining film. A large variety of chromating procedures have been developed to produce chromate films on various metal surfaces. However, there has been little or no need for chromate patterned surfaces with high dimensional tolerances. For this reason procedures for producing accurately patterned chromate films are not well known. Recently the need for such films has become apparent due to the possibility that chromate films may be useful in the fabrication of various devices including electronic circuits. Although various masking procedures may be used to produce patterned chromate films, it is highly desirable to have a more direct procedure requiring fewer steps and possibly less time so as to increase fabrication efficiency and economy. Also, higher dimensional tolerance is desirable particularly in electronic device fabrication so as to obtain smaller devices and greater packing density as well as greater reliability.

SUMMARY OF THE INVENTION

The invention is a process for producing patterned chromate films on metal substrates. Metal substrates include nonmetallic substrates (e.g., plastic, ceramic, glass, etc.) which have metal films put down on the surface such as by sensitization and electroless deposition and/or electrodeposition. Although chromate films are not well characterized, it is believed that they involve chromium oxide species, generally with the chromium ion in a relatively high oxidation state. The procedure involves first producing a chromate film on the metal substrate and then removing the chromate film from unwanted areas by a sputtering technique. Either neutral or charged particles or both may be used in the sputtering procedure. Chromate film removal may be monitored by detection of the sputtered chromium optical radiation. This procedure produces patterned chromate films on metal substrates which have high dimensional precision and accuracy. The metal substrate containing the patterned chromate film may later be exposed to a gold electroplating procedure in which the chromate film acts as a mask to prevent gold plating in designated areas. This in effect produces a patterned gold film on a metal substrate. Although a large variety of metals can be used as the substrate including alloys and pure metals, the metal must be capable of accepting a chromate film. Copper, nickel and iron containing metals are examples of such metals.

DETAILED DESCRIPTION

Figure 1:
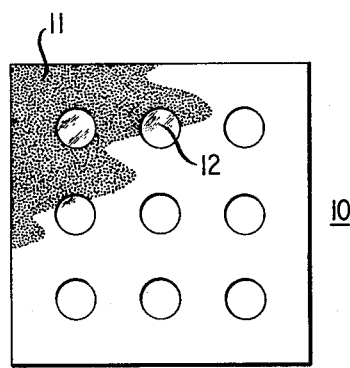
FIG. 1 shows a chromate film on a metal substrate in which circular dots of chromate film have been removed in accordance with the invention.

The procedure for producing patterned chromate film may for convenience be divided into two parts. The first part involves producing the chromate film on the metal substrate. The second part involves removal of chromate film from particular parts of the surface in order to produce the desired chromate film pattern.

Typical chromating procedures are described in a variety of references including "Chromate Conversion Coatings" by F. W. Eppensteiner and M. R. Jenkins in *Metal Finishing*, September 1975, page 29; "A Study of Surface Chromium on Tinplate" by S. E. Rauch, Jr. and R. N. Steinbicker, in *Journal of Electrochemical Society*, Vol. 120, No. 6, June 1973, page 735; and, U.S. Pat. No. 3,625,844 issued to Walter A. McKean. Chromating procedures are also described by H. N. Vazirani in U.S. Pat. No. 3,632,389, issued Apr. 3, 1968.

A typical procedure is now described. A metallic surface (for example, phosphor bronze) is first surface cleaned if required. Typically, the surface is immersed in boiling trichloroethylene for 5 minutes, air dried and immersed in an alkaline cleaner at approximately 65° C for 4 minutes. The material is then rinsed in water and acid cleaned for 3 minutes. The material surface is then rinsed in water and dried with nitrogen gas. A more complete description of cleaning and degreasing methods may be found in the literature; see for example, "Protective Coatings for Metals," Third Edition, *American Chemical Society*, Monograph 163 by R. M. Burns and W. W. Bradley, pages 27 to 54, Reinhold (1967).

A variety of methods may be used to produce the chromate film. Chemical or electrolytic methods may be used. The chromate film is generally produced cathodically using a 5 percent solution of potassium dichromate at room temperature. The electrolytic procedure may be carried out over relatively long periods at low currents (10 minutes at about 2 amperes for a one square inch section) or high currents for short periods (300 ASF for 60 seconds). After the chromating procedure, the surface is cleaned generally by rinsing with water and air drying.

Desired portions of the chromate film are removed by a sputtering technique. This sputtering technique is often carried out with a suitable shadow mask in order to make desired patterns of chromate film. Both ions and neutral atoms or molecules may be used. A variety of sputtering techniques are used depending on the rate of chromate film removal desired, the accuracy and precision of pattern film desired and whether or not it is desirable to monitor the rate of chromate film removal. For example, there is a variety of ion milling apparatus available which permits rapid removal of chromate film. In ion milling, charged particles are made to impinge on the surface containing the film. These charged particles essentially knock out particles of the film. Other techniques may be used to knock out particles of the film including rf (radio frequency) and plasma discharge. In these techniques, both positive and negative charged particles are produced and the substrate with chromate film is biased positive or negative so as to attract the (negative or positive) charged particles. A mask may be used to define the area where chromate film is to be removed.

Various ions and atoms or molecules are useful including nitrogen, rare gases such as argon, krypton, xenon, etc. Heavier atoms are generally more effective in removing film (because of greater momentum transfer) but this is limited by the cost and availability of the particles used and control of the rate of film removal. Also, less chemically reactive species, such as rare gases, are preferred to reduce or eliminate contamination of the film and substrate.

A particularly convenient apparatus and technique for back sputtering of chromate films is the so-called SCANIIR surface analysis technique. The word SCANIIR stands for Surface Composition by Analysis of Neutral and Ion Impact Radiation. This technique is summarized in an article entitled "Surface Composition by Analysis of Neutral and Ion Impact Radiation" by C. W. White, D. L. Simms, and N. H. Tolk in the book *Characterization of Solid Surfaces* edited by P. F. Kane and G. B. Larrabee, Plenum Press, New York, 1974. Here a possible back scattering technique is described in detail. Shadow masks are used to delineate the desired pattern. Although a variety of projectiles are used, including rare gas atoms and nitrogen molecules, argon atom projectiles are preferred for sputtering chromate films. The removal of chromium atoms is monitored by observation of the optical radiation given off during the back sputtering. Since atoms and molecules are being sputtered from the surface by the impinging beam, the intensity of the chromium optical radiation measured as a function of bombardment time can be used to estimate the initial thickness of the film and to indicate when the protective film has been completely removed. The resulting patterned chromate films are useful without further processing or may be further processed. In particular, the patterned chromate film is useful as a mask so as to produce patterned gold films.

Some care must be used in carrying out the gold electroplating procedure. In most gold plating applications it is often desirable to use somewhat severe conditions so as to maximize plating speed and adherence of the gold plated layer to the substrate. Some of these gold plating conditions sometimes have to be modified to insure that the chromate film acts as a gold plating mask.

For the best chromate films a large variety of gold plating procedures may be used. Such gold plating procedures have been described in many references including "Gold Plating Technology" by F. H. Reid and W. Goldie, *Electrochemical Publications Limited*, 1974, and *Modern Electroplating* edited by F. W. Lowenheim, second edition, Wiley, New York, 1963.

Some typical compositions for electroplating solutions are given below. These electroplating procedures may be carried out at room temperature unless otherwise indicated.

| | |
|---|---|
| 1. Hard Gold | |
| Potassium gold cyanide KAu(CN)$_2$ | 12–46 gm/l |
| Citric acid Anhydrous | 80–120 gm/l |
| KOH | 4–6 gm/l |
| Cobalt Citrate | 100–200 ppm |
| 2. Hard Gold | |
| Potassium gold cyanide | 4–46 gm/l |
| Phosphoric acid to adjust pH to approximately 4.2 | |
| Cobalt citrate | 20–200 ppm |
| 3. Soft Gold | |
| Potassium gold cyanide | 4–46 gm/l |
| Potassium hydrogen phosphate | 40 gm/l |
| Potassium dihydrogen phosphate | 10 gm/l |
| This yields a solution with pH approximately 7.0 and plating should be carried out at a temperature of approximately 65 degrees C. | |
| 4. Soft Gold | |
| Potassium gold cyanide | 5–30 gm/l |
| (NH$_4$)$_2$HC$_6$H$_5$O$_7$ | 7–60 gm/l |
| pH 5–6.5 plating temperature approximately 65 degrees C. | |

For best results, particularly in the sharpness with which the chromate film acts as a mask, a citrate gold plating bath should be used. The composition which may vary by ± 20 percent without deleterious effects is as follows: 20 grams per liter potassium gold cyanide and 50 grams per liter dibasic ammonium citrate. Although this bath may be, and is, generally designed to operate at approximately 65° C, room temperature operation is sometimes preferred where the chromate film is thin and porous. Current densities are in the range from 2 to 5 ASF. Lower current densities can be used but it is generally wasteful of time. Higher current densities may, under certain conditions, decrease the masking capabilities of the chromate film.

A particular example may serve to illustrate the invention. A copper coupon of approximate size 1 inch by 0.5 inch is degreased by a ten minute immersion in boiling trichloroethylene. The metallic surface is then activated for chromating by immersion in a cleaning solution for 1 minute. The metallic surface is then chromated by immersing in a 5 percent potassium dichromate solution at room temperature and applying a 300 ASF cathodic current for 60 seconds. The metallic surfaces are then thoroughly rinsed and dried.

Circular portions of the chromate film are then removed by a back sputtering technique. A shadow mask with circular openings is used to define the area in which chromate film was removed. Sputtering is accomplished using the SCANIIR surface analysis apparatus. The projectiles used are argon atoms at 8 keV at a current density of approximately $1.5 \times 10^{-6}$ amp/cm$^2$. Since atoms and molecules are being sputtered from the surface by the impinging beam, measuring the intensity of chromate optical radiation gives an indication of the initial thickness of the chromate layer and an indication of when the chromate has been completely removed from the surface. It is estimated that the sputtering rate under these conditions is approximately 6 Angstroms/min. FIG. 1 shows the results of this procedure after completion of the back sputtering. Circular areas are approximately 20 mils in diameter. The metal substrate 10 is largely covered with chromate film 11 with circular islands 12 where chromate film has been removed exposing the underlying metallic substrate.

This metallic substrate may be further processed so as to plate gold on the exposed circular islands. A typical procedure is to use a citrate gold plating bath with the following composition: 20gm/lKAu(CN)$_2$ and 50 gm/l dibasic ammonium citrate. The plating is carried out at room temperature at current densities less than 5 ASF.

Figure 2:
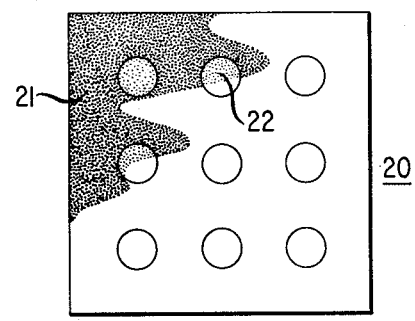
FIG. 2 shows an article like that shown in FIG. 1 which has been exposed to a gold plating procedure which permits gold plating in the dots where chromate mask has been removed and prevents gold plating on the part of the surface where chromate film remains.

FIG. 2 is a metal substrate 20 showing the results of the gold plating. The area with chromate film 21 effectively masks and prevents gold plating whereas the areas 22 free of chromate film are gold plated.

Figure 3:
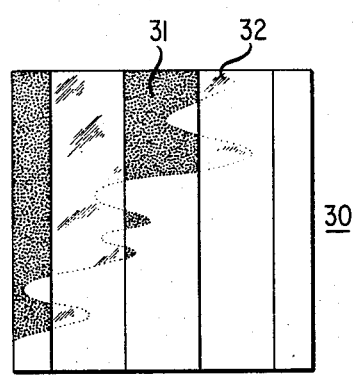
FIG. 3 shows a substrate with alternate strips of chromate film and exposed copper metal.
Figure 4:
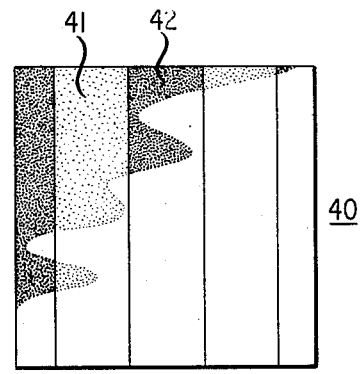
FIG. 4 shows an article like that shown in FIG. 3 which has been exposed to a gold plating procedure yielding stripped areas with gold plating and other stripped areas with chromate film.

FIG. 3 shows another metal substrate 30 in which areas of chromate film 31 and areas free of chromate film 32 (removed in accordance with the procedure described above) are in the form of stripes rather than circles. This substrate was gold plated in the same way as described above to yield a pattern shown in FIG. 4. Here the metal substrate 40 has areas of gold plate 41 and areas of chromate film 42.

What is claimed is:

1. A process for producing patterned chromate film on metallic substrates in which part of the metallic surface is covered with chromate film comprising the step of
    (a) removing chromate film from designated areas of the chromated metallic substrate by sputtering so as to form a patterned chromate film on a metallic substrate.

2. The process of claim 1 in which the sputtering is carried out by ion milling.

3. The process of claim 1 in which the sputtering is carried out by rf discharge.

4. The process of claim 1 in which the sputtering is carried out by plasma discharge.

5. The process of claim 1 in which the sputtering is carried out with neutral particle.

6. The process of claim 5 in which the neutral particles are argon atoms.

7. The process of claim 1 in which the metallic substrate with patterned chromate film is exposed to a gold plating procedure so that the chromate film acts as a mask to gold electroplating and gold is electroplated on the unchromated part of the metallic surface.

8. The process of claim 7 in which the gold electroplating procedure involves use of a citrate buffered gold plating solution.

9. The process of claim 8 in which the gold electroplating procedure employs current density less than 5 ASF.

10. The process of claim 8 in which the gold electroplating procedure is carried out at approximately room temperature.

* * * * *